(12) United States Patent
Zhong et al.

(10) Patent No.: US 8,624,671 B2
(45) Date of Patent: Jan. 7, 2014

(54) AUDIO AMPLIFYING CIRCUIT WITH IMPROVED NOISE PERFORMANCE

(75) Inventors: GuoHua Zhong, Shenzhen (CN); XiangSheng Li, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 50 days.

(21) Appl. No.: 13/313,273

(22) Filed: Dec. 7, 2011

(65) Prior Publication Data
US 2012/0169421 A1 Jul. 5, 2012

(30) Foreign Application Priority Data
Dec. 29, 2010 (CN) .......................... 2010 1 0624729

(51) Int. Cl.
*H03F 3/45* (2006.01)
(52) U.S. Cl.
USPC ........................ 330/253; 330/252; 330/257

(58) Field of Classification Search
USPC .................................................. 330/252–261
See application file for complete search history.

(56) References Cited

U.S. PATENT DOCUMENTS 7,671,674 B2 * 3/2010 Freeke ............................ 330/69

* cited by examiner

*Primary Examiner* — Hieu Nguyen
(74) *Attorney, Agent, or Firm* — Gardere Wynne Sewell LLP (57) ABSTRACT

An amplifying circuit includes a first circuit component configured to receive and amplify first and second input voltages to generate an output voltage. The first circuit component is formed by a first amplifier and a second amplifier. A second circuit component is configured to provide a first offset current that is associated with a first input current of the first amplifier. The first offset current compensates for variation in the first input current. A third circuit component is configured to provide a second offset current that is associated with a second input current of the second amplifier. The second offset current compensates for variation in the second input current.

21 Claims, 4 Drawing Sheets

AUDIO AMPLIFYING CIRCUIT WITH IMPROVED NOISE PERFORMANCE

PRIORITY CLAIM

This application claims priority from Chinese Application for Patent No. 201010624729.8 filed Dec. 29, 2010, the disclosure of which is hereby incorporated by reference.

TECHNICAL FIELD

This invention relates generally to electronic circuits, and more particularly to an amplifying circuit used in audio systems.

BACKGROUND

Many audio amplifying circuits may generate an audible sound when operation state of the audio amplifying circuits transfers from play to mute or from mute to play. The main reason for this is that input currents at input nodes of the audio amplifying circuits do not match with each other, which introduces a voltage difference into the circuit. Typically, this sound is audible as a popping sound. As this popping sound is a disturbance to users, it would be desirable to eliminate or at least reduce this popping noise.

Figure 1:
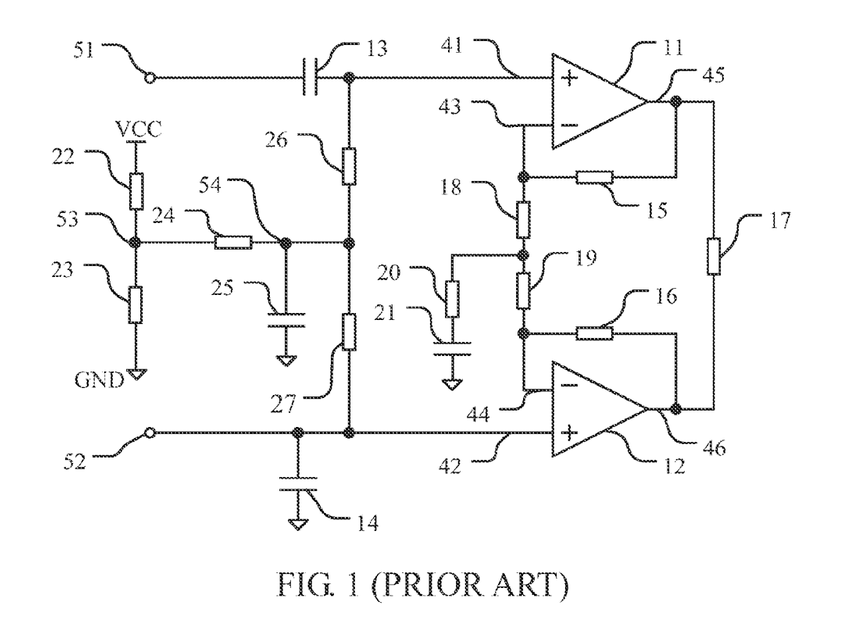
FIG. 1 shows an audio amplifying circuit.

FIG. 1 shows an audio amplifying circuit incorporating popping noise countermeasure. The amplifying circuit comprises a first operational amplifier 11 and a second operational amplifier 12, which together serve as a differential amplifying circuit. A non-inverting input node 41 of the first amplifier 11 is coupled to a first terminal 51 via a first capacitor 13. A non-inverting input node 42 of the second amplifier 12 is coupled to a second terminal 52, and a second capacitor 14 is coupled between the second terminal 52 and ground. The first terminal 51 is configured to receive audio signals while the second terminal 52 is configured as an AC ground relative to the audio signals received at the first terminal 51. A first output node 45 of the first amplifier 11 is coupled to an inverting input 43 of the first amplifier 11 via a first resistor 15. A second output node 46 of the second amplifier 12 is coupled to an inverting input 44 of the second amplifier 12 via a second resistor 16. The output nodes 45 and 46 of the amplifiers 11, 12 are coupled across a load 17, typically a loudspeaker able to give out sounds according to the current flowing therethrough. A third resistor 18 and a fourth resistor 19 coupled in series are interposed between the inverting inputs 43, 44 of the first and second amplifiers 11, 12. The common node of the third resistor 18 and the fourth resistor 19 is coupled to ground via a fifth resistor 20 and a third capacitor 21 coupled in series. The series-coupled fifth resistor 20 and third capacitor 21 have the function of filtering noise and adjusting frequency response of the amplifying circuit.

The amplifying circuit further comprises a reference circuit component providing a reference voltage to the non-inverting input 41, 42 of the amplifiers 11, 12. The reference circuit component comprises a sixth resistor 22, a seventh resistor 23, an eighth resistor 24, a fourth capacitor 25, a ninth resistor 26 and a tenth resistor 27. The sixth resistor 22 and the seventh resistor 23 forming a divider are series-coupled between a supply power VCC and ground, which set the voltage at node 53 to a reference voltage. For example, the reference voltage may be chosen to be equal to VCC/2 and the values of resistor 22, 23 are then set to a same value. The common node of the resistors 22 and 23, that is, the node 53, is coupled to a first node of the eighth resistor 24, and the other node of the eighth resistor 24 serves as a reference node 54, which is coupled to ground via the fourth capacitor 25. The fourth capacitor 25 has the function of rejecting power noise from the supply power VCC. The reference node 54 is coupled to the non-inverting input node 41 of the first amplifier 11 via the ninth resistor 26, and coupled to the non-inverting input node 42 of the second amplifier 12 via the tenth resistor 27, respectively.

The amplifying circuit is such designed to reduce the popping noise. Usually, audio circuits are fit to more than one channel, for example 2 or 4 channels, in the purpose of reproducing sounds more vividly and accurately. Still referring to FIG. 1, the amplifying circuit is fit to a four-channel audio amplifier. As a result, it is required that a second input current $I_{in2}$ flowing from the input node 42 into the second capacitor 14 should be four times bigger than a first input current $I_{in1}$ flowing from the input node 41 into the first capacitor 13. As is known, when there are no signals received at the input nodes 41 and 42, there should be no voltage difference between these two nodes. Therefore, the ratio of the capacitors 13 and 14 should be four in accordance with the ratio of the input currents and $I_{in1}$ and $I_{in2}$. At the same time, in order to achieve the requirement of current matching, the ninth resistor 26 and the tenth resistor 27 that are separately coupled to the non-inverting inputs should be set in accordance with the currents flowing therethrough. That is, the value of the ninth resistor 26 should be four times bigger than that of the tenth resistor 27.

However, it is difficult to assure the first and second capacitors 13, 14 to satisfy the requirement. Mismatch between the first and second capacitors 13, 14 frequently happens. The mismatch between capacitors 13 and 14 may significantly influence the normal operation of the amplifying circuit, and the popping noise cannot be fully eliminated, especially when the supply power fluctuates greatly, for example, the output of supply power in a car changes a lot when the car is starting.

Figure 2:
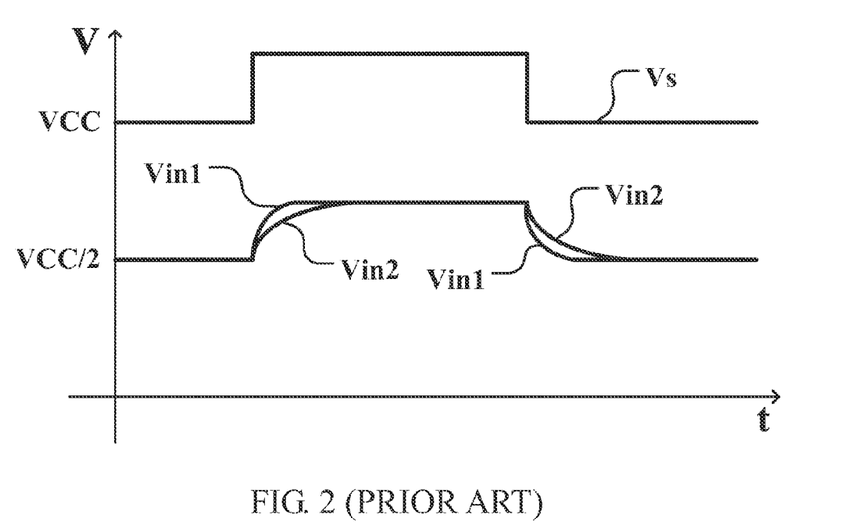
FIGS. 2 and 3 show the evolution of voltages along time at given points of the audio amplifying circuit of FIG. 1.
Figure 3:
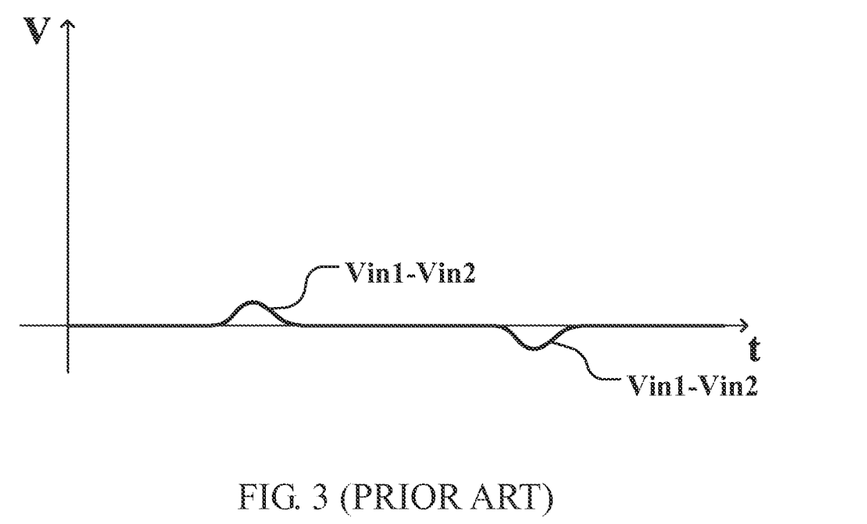

FIG. 2 shows the evolution of voltages along time at given points of the amplifying circuit of FIG. 1, when there is a big pulse from the supply power. Curve Vs shows the variation of the supply voltage along time. Curve $V_{in1}$ shows the variation of the voltage at the input node 41 along time. Curve $V_{in2}$ shows the variation of the voltage at the input node 42 along time. The settle time, that is, the rise or fall time of the voltage at the input node 41 is mainly determined by the values of the capacitor 13 and the input current $I_{in1}$, and the settle time of the voltage at the input node 42 is determined by the values of the capacitor 14 and the input current $I_{in2}$. However, the ratio of the capacitors does not always accord with the ratio of the input currents flowing into the capacitors, which leads to different settle times for input nodes 41, 42, as illustrated in FIG. 2. In FIG. 3, curve $V_{in1}-V_{in2}$ shows the voltage difference between voltages at the input nodes 41 and 42. Further, the voltage difference is reflected on the load 17, multiplied by the amplifying gain of the amplifying circuit. Due to a high amplifying gain, the voltage applied to the load 17 is often sufficient to cause a characteristic audible and unpleasant noise.

Moreover, the device mismatch between the first capacitor 13 and the second capacitor 14 can also introduce electromagnetic noise such as global system for mobile communication (GSM) noise into the amplifying circuit, which is amplified to a bigger noise by the subsequent amplifiers 11 and 12.

Thus, there is a need for improving the noise performance of the audio amplifying circuit.

SUMMARY

In one embodiment, an amplifying circuit comprises a first circuit component configured to receive and amplify a first input voltage and a second input voltage and to generate an output voltage, wherein the first circuit component comprises a first amplifier and a second amplifier; a second circuit component configured to provide a first offset current associated with a first input current of the first amplifier to compensate for variation in the first input current; and a third circuit component configured to provide a second offset current associated with a second input current of the second amplifier to compensate for variation in the second input current.

According to an embodiment, the first offset current is substantially equal to the first input current and the second offset current is substantially equal to the second input current.

According to an embodiment, the second circuit component comprises a first current mirror configured to mirror the first input current, and the third circuit component comprises a second current mirror configured to mirror the second input current.

According to an embodiment, the first amplifier comprises a first pair of bipolar transistors serving as an input stage, which is biased by a first MOS transistor configured to provide a first reference current, and the first current mirror comprises a first bipolar transistor, a second MOS transistor, a third MOS transistor, and a fourth MOS transistor, wherein the second MOS transistor is configured to provide a second reference current, the source of the second MOS transistor is coupled to an emitter of the first bipolar transistor, the collector of the first bipolar transistor is coupled to a first supply node with a source of the third MOS transistor and a source of the fourth MOS transistor, a base of the first bipolar transistor is coupled to a drain and gate of the third MOS transistor and a gate of the fourth MOS transistor, and a drain of the fourth MOS transistor is coupled to the first input node; and the second current mirror has the a structure as the first current mirror.

The foregoing has outlined, rather broadly, features of the present disclosure. Additional features of the disclosure will be described, hereinafter, which form the subject of the claims of the invention. It will be appreciated by those skilled in the art that the conception and specific embodiment disclosed may be readily utilized as a basis for modifying or designing other structures or processes for carrying out the same purposes of the present invention. It will also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different Figures generally refer to corresponding parts unless otherwise indicated. The Figures are drawn to clearly illustrate the relevant aspects of embodiments of the present disclosure and are not necessarily drawn to scale. To more clearly illustrate certain embodiments, a letter indicating variations of the same structure, material, or process step may follow a Figure number.

DETAILED DESCRIPTION OF THE DRAWINGS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 4:
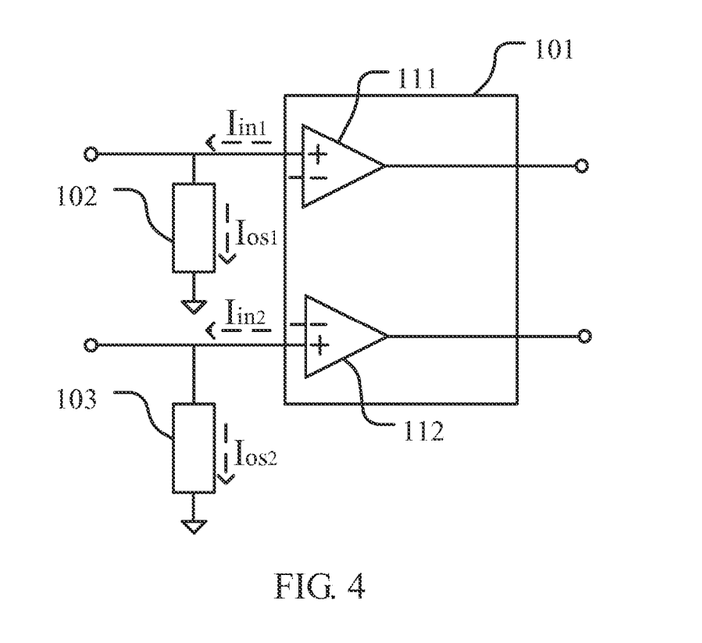
FIG. 4 shows an amplifying circuit according to an embodiment.

FIG. 4 shows an amplifying circuit according to an embodiment. In the embodiment, the amplifying circuit is used for amplifying signals such as audio signals, and the amplifying circuit is supplied by power source such as car batteries. In some other embodiments, the amplifying circuit can be used in conditions such as television sets, mobile phones or other electronic products and supplied by correspondent power sources.

As shown in FIG. 4, the amplifying circuit according to the embodiment comprises a first circuit component 101 configured to receive and amplify a first input voltage and a second input voltage and to generate an output voltage, wherein the first circuit component 101 comprises a first amplifier 111 and a second amplifier 112. In the embodiment, the first amplifier 111 and the second amplifier 112 are operational amplifiers with two input nodes respectively, that is, non-inverting input node and inverting input node of operational amplifiers. The two operational amplifiers of the first circuit component 101 are bridge-connected and serve as a differential amplifying circuit to amplify a voltage difference between the first input voltage received by the first amplifier 111 and the second input voltage received by the second amplifier 112. Thus, the output voltage generated by the first circuit component 101 is given by the voltage difference and a gain of the differential amplifying circuit, which will be further described in the following paragraphs.

The amplifying circuit further comprises a second circuit component 102 configured to provide a first offset current $I_{os1}$ associated with a first input current $I_{in1}$ of the first amplifier 111 to compensate for variation in the first input current $I_{in1}$; and a third circuit component 103 configured to provide a second offset current $I_{os2}$ associated with a second input current $I_{in2}$ of the second amplifier to compensate for variation in the second input current $I_{in2}$. In an embodiment, the first input current $I_{in1}$ is the current flowing into one of the input nodes of the first amplifier 111 and the second input current $I_{in2}$ is the current flowing into one of the input nodes of the second amplifier 112. Since the offset currents are associated with the input currents, that is, the offset currents changes with the input current respectively, for example, the offset current is proportional to the input currents, and the variation in the input currents is compensated and will not flow into coupling capacitors or input capacitors coupled to the input nodes. Thus, there will exist null or at least reduced voltage difference when no input signals have been received. In a preferred embodiment, the first offset current $I_{os1}$ is substantially equal to the first input current $I_{in1}$ and the second offset current $I_{os2}$ is substantially equal to the second input current $I_{in2}$, and therefore the variation in the input current can be fully compensated by the offset currents respectively. For amplifiers in the first circuit component, the variation in the input currents could be induced by the fluctuation of supply powers, and then the amplifying circuit has a better power supply rejection ratio (PSRR) performance than the amplifying circuit in FIG. 1.

Figure 5:
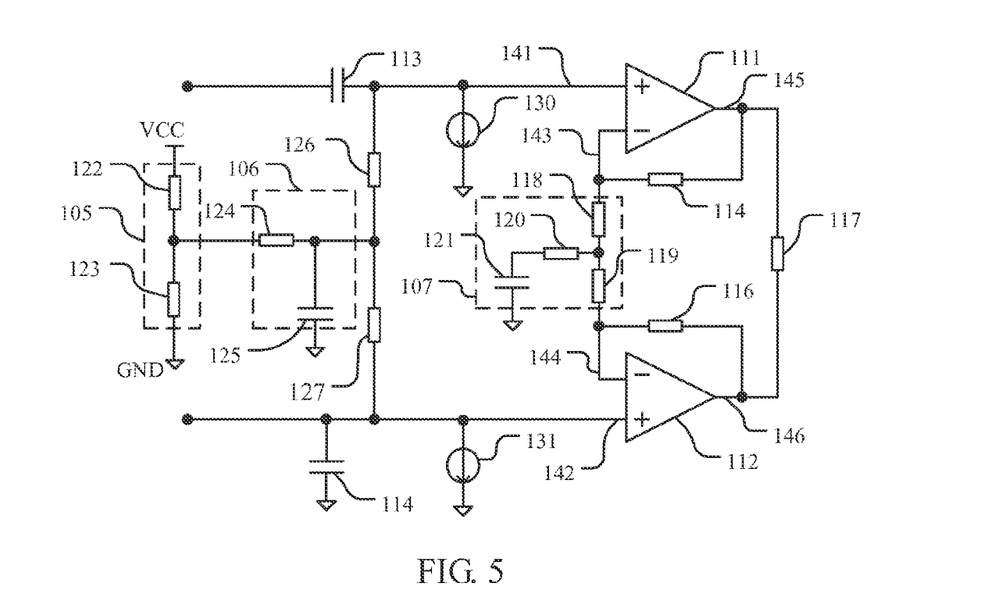
FIG. 5 shows an example of architecture of an amplifying circuit according to another embodiment.

FIG. 5 shows an example of architecture of an amplifying circuit according to another embodiment.

As shown in FIG. 5, the amplifying circuit comprises a circuit component comprising a first amplifier 111 having a first input node 141, a third input node 143 and a first output node 145, and a second amplifier 112 having a second input node 142, a fourth input node 144 and a second output node 146. In the embodiment, the first input node 141 and the second input node 142 are non-inverting input nodes of the amplifiers, and the third input node 143 and the fourth input node 144 are inverting input nodes of the amplifiers. As mentioned in the preceding paragraphs, the first amplifier 111 receives a first input voltage and a first input current at the first input node 141, and the second amplifier 112 receives the second input voltage and the second input current at the second input node 142. The third input node 143 is coupled to the first output node 145 via a first resistor 114, the fourth input node 144 is coupled to the second output node 146 via a second resistor 116, and the third input node 143 is coupled to the fourth input node 144 via an impedance component 107. The first circuit component is such configured as a differential amplifying circuit, and then the amplifying circuit generates the output voltage between the first and second output nodes 145, 146.

In a preferred embodiment, the first circuit component further comprises a load 117 coupled between the first and second output nodes 145, 146, typically a loudspeaker able to give out sounds according to the current flowing therethrough. The expression of the output voltage $V_{out}$ across the load 117 is given by the following equation:

$$V_{out} = V_{o1} - V_{o2} = (R_1 + R_2 + Z)/Z \times (V_{in1} - V_{in2})$$

Where $R_1$ and $R_2$ are the respective values of resistor 114 and 116, and Z is the impedance of the impedance component 107, and $V_{o1}$, $V_{o2}$, $V_{in1}$ and $V_{in2}$ are the voltages at the output nodes 145, 146 and the input nodes 141, 142, respectively.

The impedance component 107 can comprise resistors and/or capacitors. In an embodiment, the impedance component 107 comprises a resistor with its two nodes coupled to the third input node 143 and the fourth input node 144 respectively. In another embodiment, the impedance component 107 comprises a fourth resistor 118, a fifth resistor 119, a sixth resistor 120 and a first capacitor 121, wherein the fourth and fifth resistors 118, 119 are coupled in series between the third and fourth input nodes 143, 144, and a common node of the fourth and fifth resistor 118, 119 is coupled to a first supply node via the series coupled sixth resistor 120 and first capacitor 121. The first supply node can be ground or a negative power supply node. The series-coupled sixth resistor 120 and first capacitor 121 have the function of filtering noise and adjusting frequency response of the amplifying circuit. It should be understood that the schematic of the first circuit component is merely an example, any circuit serving as an amplifying circuit with two input nodes is within the scope of the present invention.

The amplifying circuit in FIG. 5 further comprises another circuit component configured to provide a reference voltage to the first circuit component. This circuit component comprises a divider 105 having a seventh resistor 122 and an eighth resistor 123 coupled in series between a second supply node and the first supply node. The second supply node can be a positive power supply node. The common node of the seventh resistor 122 and the eighth resistor 123 provides the reference voltage via a ninth resistor 126 to the first amplifier 111 and to the second amplifier 112 via a tenth resistor 127, which sets the input nodes of the first circuit component in normal operation. In a specific embodiment, the ninth resistor 126 has a same resistance as the tenth resistor 127.

In a preferred embodiment, another circuit component comprises a low-pass filter 106, which is configured to filter high frequency noise in the reference voltage before supplying the reference voltage to the first circuit component. Optionally, the low-pass filter 106 comprises an eleventh resistor 124 and a fourth capacitor 125, and the fourth capacitor 125 can be coupled to the first supply node.

According to the embodiment of FIG. 5, the amplifying circuit further comprises a second capacitor 113 and a third capacitor 114. A first node of the second capacitor 113 is coupled to the first input node 141 and the other node of the second capacitor 113 is configured to receive the first input voltage $V_{in1}$, and therefore the second capacitor 113 serves as a coupling capacitor to filter low frequency noise in the first input voltage $V_{in1}$. A first node of the third capacitor 114 is coupled to the second input node 142 and the other node of the third capacitor 114 is coupled to the first supply node, and therefore the third capacitor 114 severs as a coupling capacitor configured to filter high frequency noise in the second input voltage $V_{in2}$.

As mentioned in FIG. 4, the second circuit component 102 and the third circuit component 103 are configured to compensate for variations in the input currents at the input nodes 141, 142, respectively. According to the embodiment of FIG. 5, the second circuit component comprises a first current mirror 130 configured to mirror the first input current $I_{in1}$, and the third circuit component comprises a second current mirror 131 configured to mirror the second input current $I_{in2}$. Since the input currents are fully mirrored, the input currents can be fully drawn into the first supply node by the respective current mirrors, and no input currents will flow into the coupling capacitors 113 and 114. As a result, when the input voltages includes no alternating components, that is, no signals such as audio signal are being received, the voltage applied on the capacitors 113 and 114 will not change and then the input mismatch is fully compensated.

Figure 6:
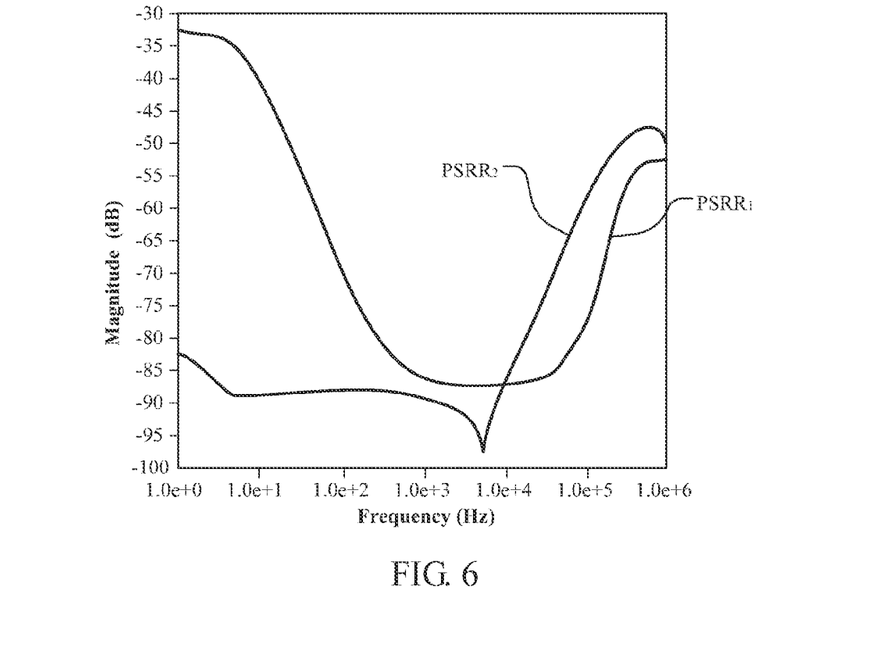
FIG. 6 shows a simulation result of PSRR performance according to the embodiment of FIG. 5.

FIG. 6 shows a simulation result of PSRR performance according to the embodiment of FIG. 5. The curve $PSRR_1$ shows the PSRR performance along frequency of the amplifying circuit of FIG. 1, and the curve $PSRR_2$ shows the PSRR performance along frequency of the amplifying circuit according to the embodiment of FIG. 5. Compared with the conventional amplifying circuit of FIG. 1, the amplifying circuit of FIG. 5 has a better noise rejection at low frequencies. Since the bandwidth of audio signals is generally around 20 kHz and the noise existed in power supplies concentrates at low frequencies, the amplifying circuit in FIG. 5 has a better PSRR performance.

Figure 7:
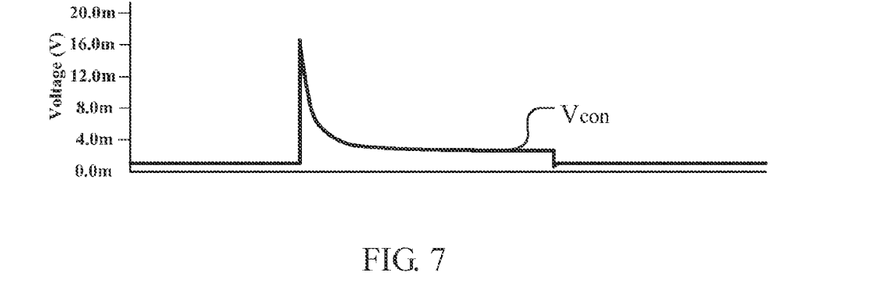
FIG. 7 shows the evolution of voltages along time at given points of the amplifying circuit of FIG. 1 when power supply fluctuates.
Figure 8:
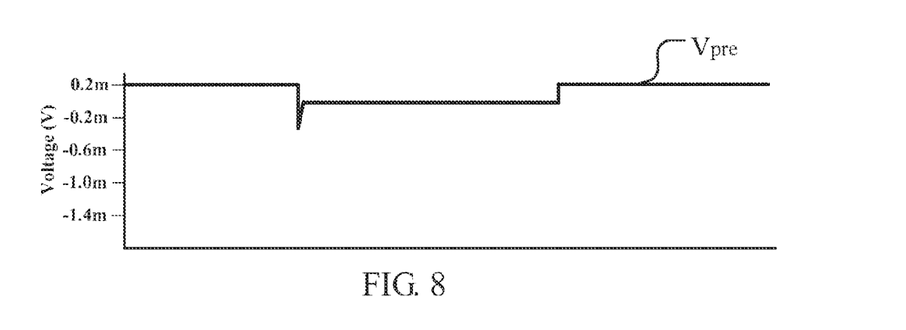
FIG. 8 shows the evolution of voltages along time at given points of the amplifying circuit of FIG. 5 when power supply fluctuates.

FIGS. 7 and 8 show the evolution of voltages along time at given points of the amplifying circuit of FIGS. 1 and 5 when power supply fluctuates. Curve $V_{con}$ shows the variation of the output voltage across the load 17 in FIG. 1, and curve $V_{pre}$ shows the variation of the output voltage across the load 117 in FIG. 5. The variation of output voltage is produced by the operation state of the circuits transferring from mute to play or reversely. As shown in FIG. 8, the output voltage across the load 117 according to the embodiment of FIG. 5 changes little compared with the conventional amplifying circuit in FIG. 1, and therefore the sound given out by the load can be ignored.

Still referring to FIG. 5, in an optional embodiment, the capacitors 113 and 114 can have a same capacitance. As a result, an electromagnetic noise, for example, a GSM noise coupled by the capacitors 113, 114 applies a same voltage to the input nodes 141, 142, therefore the voltage difference between the two input nodes is quite small and will not generate a measurable output voltage across the load 117. This configuration further improves the noise performance of the amplifying circuit according to the embodiment when electromagnetic noise occurs.

Figure 9:
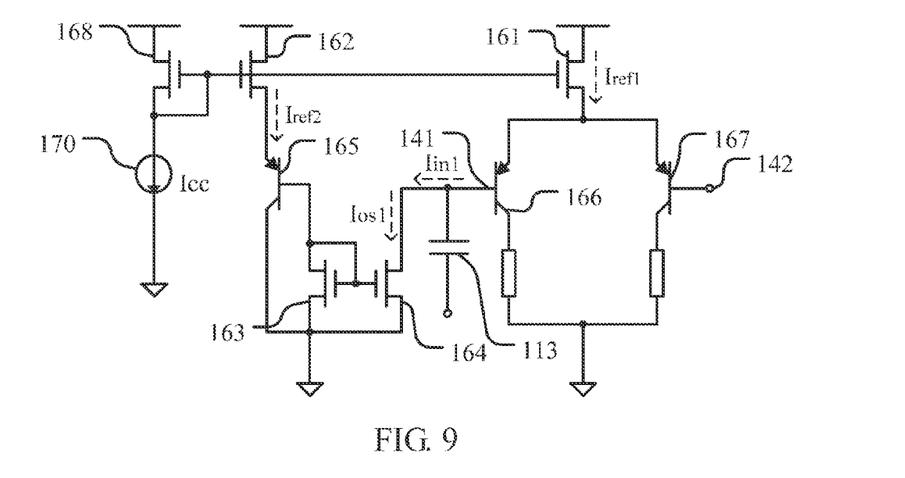
FIG. 9 shows a detailed schematic of the first amplifier and the second circuit component of the amplifying circuit in FIG. 5.

FIG. 9 shows a detailed schematic of the first amplifier and the second circuit component of the amplifying circuit in FIG. 5. The schematic structure of the second amplifier and the third circuit component can be the same as the first amplifier and the second circuit component.

As shown in FIG. 9, the first amplifier comprises a first pair of bipolar transistors 166, 167 serving as an input stage, which is biased by a first reference current $I_{ref1}$ provided by a first MOS transistor 161. In an embodiment, a gate of first MOS transistor 161 is coupled to a gate of a fifth MOS transistor 168, and the gate and source of the fifth MOS transistor 168 is coupled to a first current source 170. The first MOS transistor 161 and the fifth MOS transistor 168 is such configured as a current mirror. When the amplifying circuit is working, the first current source 170 generates a constant current $I_{cc}$ which flows through the fifth MOS transistor 168, and then the first reference current $I_{ref1}$ associated with the constant current $I_{cc}$ will be generated by the current mirror. The expression of the first reference current $I_{ref1}$ is given by the following equation:

$$I_{ref1} = \frac{(W/L)_1}{(W/L)_5} I_{cc}$$

Where $(W/L)_1$ is the ratio of the width and length of the first MOS transistor 161, and $(W/L)_5$ is the ratio of the width and length of the fifth MOS transistor 168. The first reference current $I_{ref1}$ is further supplied to the bipolar transistors 166, 167. Accordingly, the input currents of the first amplifier is given by the following equation:

$$I_{in1} = I_{ref1}/2\beta_{6,7}$$

Where $\beta_{6,7}$ is the ratio of the current flowing through the collector of bipolar transistors 166, 167 and the current flowing through the base of the bipolar transistors 166, 167.

On the other hand, the first current mirror of the second circuit component comprises a first bipolar transistor 165, a second MOS transistor 162, a third MOS transistor 163, and a fourth MOS transistor 164, wherein the second MOS transistor 162 is configured to provide a second reference current $I_{ref2}$ associated with a constant current. In a preferred embodiment, the second reference current $I_{ref2}$ can be generated from the same current source $I_{cc}$, and then the expression of the second current $I_{ref2}$ is given by the following equation:

$$I_{ref2} = \frac{(W/L)_1}{(W/L)_2} I_{cc}$$

Where $(W/L)_2$ is the ratio of the width and length of the second MOS transistor 162.

In order to generate the first offset current $I_{os1}$ associated with the first input current $I_{in1}$, especially a substantially equal offset current, the source of the second MOS transistor 162 is coupled to an emitter of the first bipolar transistor 165, the collector of the first bipolar transistor 165 is coupled to a first supply node with a source of the third MOS transistor 163 and a source of the fourth MOS transistor 164, a base of the first bipolar transistor 165 is coupled to a drain and gate of the third MOS transistor 163 and a gate of the fourth MOS transistor 164, and a drain of the fourth MOS transistor 164 is coupled to the first input node 141. As a result, the expression of the first offset current $I_{os1}$ is given by the following equation:

$$I_{os1} = I_{ref2}/\beta_5$$

Where $\beta_5$ is the ratio of the current flowing through the collector of bipolar transistors 165 and the current flowing through the base of the bipolar transistor 165.

In a preferred embodiment, the second reference current $I_{ref2}$ can be half of the first reference current $I_{ref1}$, for example, $(W/L)_2$ of the second MOS transistor 162 can be half of $(W/L)_1$ of the first MOS transistor 161, and the first bipolar transistor 165 can be identical to each of the first pair of bipolar transistors 166, 167 which lead to a same value for $\beta_5$ and $\beta_{6,7}$. It should be understood any combination of the W/L and β which makes the second reference current $I_{ref2}$ half of the first reference current $I_{ref1}$ is within the scope of the present invention. Therefore, the first offset current $I_{os1}$ is substantially equal to the first input current $I_{in1}$. When the first input current $I_{in1}$ varies, the first offset current $I_{os1}$ will changes accordingly, and then the first input current $I_{in1}$ will not flow into the capacitor 113. As a result, when the input voltage includes no alternating components, the first input voltage applied to the first input node will not change. Similarly, the second input voltage applied to the second input will not change as well, and therefore the input mismatch will be fully compensated.

In another embodiment, the amplifying circuit can be configured to amplify signals of different channels in audio systems. Therefore, the first circuit component can further comprise one or more amplifiers configured to receive one or more input voltages respectively, and the amplifying circuit generates one or more output voltages associated with voltage differences between the one or more input voltages and the second input voltage respectively. Accordingly, the amplifying circuit further comprises one or more circuit components configured to provide offset currents associated with input currents of the one or more amplifiers to compensate for variation in the input currents respectively.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:
1. An amplifying circuit, comprising:
 a first circuit component configured to receive at first and second input nodes and amplify a first input voltage and a second input voltage, respectively, wherein the first circuit component comprises a first amplifier having a first input current at the first input node and a second amplifier having a second input current at the second input node;

a second circuit component configured to provide a first offset current summed with the first input current at the first input node of the first amplifier to compensate for variation in the first input current; and a third circuit component configured to provide a second offset current summed with the second input current at the second input node of the second amplifier to compensate for variation in the second input current;

wherein the first offset current is mirrored from a reference current of the first amplifier and the second offset current is mirrored from a reference current of the second amplifier.

2. The amplifying circuit of claim 1, wherein the first input current has a different value from the second input current.

3. The amplifying circuit of claim 1, further comprising: a fourth circuit component configured to provide a reference voltage to the first circuit component.

4. An amplifying circuit, comprising:
a first circuit component configured to receive at first and second input nodes and amplify a first input voltage and a second input voltage, respectively, wherein the first circuit component comprises a first amplifier having a first input current at the first input node and a second amplifier having a second input current at the second input node;

a second circuit component configured to provide a first offset current summed with the first input current at the first input node of the first amplifier to compensate for variation in the first input current; and a third circuit component configured to provide a second offset current summed with the second input current at the second input node of the second amplifier to compensate for variation in the second input current;

wherein the second circuit component comprises a first current mirror configured to mirror a first current in generating the first input current, and the third circuit component comprises a second current mirror configured to mirror a second current in generating the second input current.

5. The amplifying circuit of claim 4, wherein the first amplifier comprises a first pair of bipolar transistors serving as an input stage, which is biased by a first reference current provided by a first MOS transistor, and the first current mirror comprises a first bipolar transistor, a second MOS transistor, a third MOS transistor, and a fourth MOS transistor, wherein the second MOS transistor is configured to provide a second reference current, a source of the second MOS transistor is coupled to an emitter of the first bipolar transistor, the collector of the first bipolar transistor is coupled to a first supply node with a source of the third MOS transistor and a source of the fourth MOS transistor, a base of the first bipolar transistor is coupled to a drain and gate of the third MOS transistor and a gate of the fourth MOS transistor, and a drain of the fourth MOS transistor is coupled to a first input node configured to receive the first input voltage.

6. The amplifying circuit of claim 5, wherein the second reference current is half of the first reference current, and the first bipolar transistor is identical to each of the first pair of bipolar transistors.

7. The amplifying circuit of claim 6, wherein the first and second reference currents are generated from a same current source.

8. An amplifying circuit, comprising:
a first circuit component configured to receive at first and second input nodes and amplify a first input voltage and a second input voltage, respectively, wherein the first circuit component comprises a first amplifier having a first input current at the first input node and a second amplifier having a second input current at the second input node;

a second circuit component configured to provide a first offset current summed with the first input current at the first input node of the first amplifier to compensate for variation in the first input current; and a third circuit component configured to provide a second offset current summed with the second input current at the second input node of the second amplifier to compensate for variation in the second input current;

wherein the first amplifier has a first input node, a third input node and a first output node, and the second amplifier has a second input node, a fourth input node and a second output node, and wherein the first amplifier is configured to receive the first input voltage and the first input current at the first input node, the second amplifier is configured to receive the second input voltage and the second input current at the second input node; the third input node is coupled to the first output node via a first resistor, the fourth input node is coupled to the second output node via a second resistor, the third input node is coupled to the fourth input node via an impedance component, and the amplifying circuit generates an output voltage between the first and second output nodes.

9. The amplifying circuit of claim 8, wherein the impedance component comprises a resistor.

10. The amplifying circuit of claim 8, wherein the impedance component comprises a fourth resistor, a fifth resistor, a sixth resistor and a first capacitor, wherein the fourth and fifth resistors are coupled in series between the third and fourth input nodes, and a common node thereof is coupled to a first supply node via the series coupled sixth resistor and first capacitor.

11. The amplifying circuit of claim 8, further comprising a load coupled between the first and second output nodes.

12. An amplifying circuit, comprising:
a first circuit component configured to receive at first and second input nodes and amplify a first input voltage and a second input voltage, respectively, wherein the first circuit component comprises a first amplifier having a first input current at the first input node and a second amplifier having a second input current at the second input node;

a second circuit component configured to provide a first offset current summed with the first input current at the first input node of the first amplifier to compensate for variation in the first input current;

a third circuit component configured to provide a second offset current summed with the second input current at the second input node of the second amplifier to compensate for variation in the second input current; and a fourth circuit component configured to provide a reference voltage to the first circuit component;

wherein the fourth circuit component comprises a divider having a seventh resistor and an eighth resistor coupled in series between a second supply node and the first supply node, the common node of the seventh and eighth resistors providing the reference voltage via a ninth resistor to the first amplifier and via a tenth resistor to the second amplifier.

13. The amplifying circuit of claim 12, wherein the fourth circuit component further comprises a low-pass filter configured to filter the reference voltage before supplying to the first circuit component.

14. The amplifying circuit of claim 12, wherein the ninth resistor has a same resistance as the tenth resistor.

15. An amplifying circuit, comprising:
a first circuit component configured to receive at first and second input nodes and amplify a first input voltage and a second input voltage, respectively, wherein the first circuit component comprises a first amplifier having a first input current at the first input node and a second amplifier having a second input current at the second input node;
a second circuit component configured to provide a first offset current summed with the first input current at the first input node of the first amplifier to compensate for variation in the first input current;
a third circuit component configured to provide a second offset current summed with the second input current at the second input node of the second amplifier to compensate for variation in the second input current;
a fourth circuit component configured to provide a reference voltage to the first circuit component; and
a second capacitor and a third capacitor, wherein a first node of the second capacitor is coupled to the first input node and a second node of the second capacitor is configured to receive the first input voltage; and a first node of the third capacitor is coupled to the second input node and a second node of the third capacitor is coupled to the first supply node.

16. The circuit of claim 15, wherein the second capacitor and the third capacitor have a same capacitance.

17. An amplifying circuit, comprising:
a pair of transistors coupled in a differential configuration;
a first current source coupled to source a first reference current to the pair of transistors;
a first current sink configured to sink an offset current from a control terminal of one transistor in said pair of transistors; and
a second current source coupled to source a second reference current,
wherein the first and second reference currents are mirrored currents derived from a third reference current; and
wherein the offset current is derived from the second reference current.

18. The amplifying circuit of claim 17, wherein the offset current is mirrored from the second reference current.

19. An amplifying circuit, comprising:
a differential amplifier circuit component having a first input voltage node configured to receive an input voltage and a second input voltage node configured to receive a feedback signal and to an output voltage node, wherein said first input voltage node is further configured to receive a first input current; and
an offset current generator configured to provide a first offset current that is sunk from said first input voltage node, wherein the first offset current is summed with said first input current at the first input voltage node to compensate for variation present in the first input current;
wherein the offset current generator comprises a first current mirror configured to mirror a reference current of the differential amplifier circuit to generate the first offset current.

20. The amplifying circuit of claim 19, wherein the first current mirror is configured to generate the first offset current from a first reference current.

21. The amplifying circuit of claim 20, wherein the differential amplifier circuit is operable responsive to a second reference current, wherein the first and second reference currents are mirrored currents derived from a third reference current.

* * * * *